(12) United States Patent
Muralidharan et al.

(10) Patent No.: US 12,333,225 B2
(45) Date of Patent: Jun. 17, 2025

(54) SYSTEM AND METHOD FOR MONITORING AND DIAGNOSIS OF ENGINE HEALTH USING A SNAPSHOT-CEOD BASED APPROACH

(71) Applicant: General Electric Company, Schenectady, NY (US)

(72) Inventors: Vasanth Muralidharan, Bangalore (IN); Yan Chen, Mason, OH (US); Trevor A. Tersmette, Montgomery, OH (US); Steven Laverne Johann, Liberty Township, OH (US); Rebinth Robin, Bangalore (IN)

(73) Assignee: General Electric Company, Evendale, OH (US)

( * ) Notice: Subject to any disclaimer, the term of this patent is extended or adjusted under 35 U.S.C. 154(b) by 731 days.

(21) Appl. No.: 17/185,295

(22) Filed: Feb. 25, 2021

(65) Prior Publication Data

US 2022/0269841 A1    Aug. 25, 2022

(51) Int. Cl.
*G06F 30/27*  (2020.01)
*G07C 5/08*   (2006.01)

(52) U.S. Cl.
CPC .......... *G06F 30/27* (2020.01); *G07C 5/0808* (2013.01)

(58) Field of Classification Search
CPC ..... G06F 30/27; G07C 5/0808; G05B 23/024; G05B 23/0237; F02C 9/00; F01D 21/003
See application file for complete search history.

(56) References Cited

U.S. PATENT DOCUMENTS

| | | | |
|---|---|---|---|
| 6,408,259 B1 | 6/2002 | Goebel et al. | |
| 6,768,938 B2 * | 7/2004 | McBrien ................ | G01H 1/006 |
| | | | 702/56 |
| 7,197,430 B2 | 3/2007 | Jacques et al. | |
| 7,991,580 B2 | 8/2011 | Sambasivan et al. | |
| 8,295,995 B2 | 10/2012 | Poisson | |
| 8,600,917 B1 * | 12/2013 | Schimert ................ | G06N 20/00 |
| | | | 706/14 |
| 8,712,739 B2 | 4/2014 | Jiang et al. | |

(Continued)

FOREIGN PATENT DOCUMENTS

| CA | 2933805 A1 | 12/2016 |
|---|---|---|
| CN | 102567569 A | 7/2012 |

(Continued)

*Primary Examiner* — Tung S Lau
(74) *Attorney, Agent, or Firm* — Dority & Manning, P.A.

(57) ABSTRACT

A system and method for monitoring and diagnosis of engine health are provided. In one aspect, a system receives continuous operating data (COD) associated with an asset. The COD includes parameter values for one or more parameters over a collection time period. The system generates synthetic snapshot data based at least in part on the COD. The synthetic snapshot data includes one or more synthetic snapshots each containing the parameter values for the one or more parameters for a given timepoint within the collection time period. The system also receives snapshot data associated with the asset. The snapshot data includes one or more snapshots each containing parameter values for the one or more parameters for a given timepoint. The system generates an output indicating a health status of the asset or one or more components thereof based at least in part on the snapshot data and the synthetic snapshot data.

16 Claims, 11 Drawing Sheets

(56) References Cited

U.S. PATENT DOCUMENTS

| | | |
|---|---|---|
| 9,239,578 B2 | 1/2016 | Ziarno |
| 9,405,291 B2 | 8/2016 | Sharpe, Jr. et al. |
| 9,424,693 B2 | 8/2016 | Rodrigues |
| 9,628,499 B1 | 4/2017 | Yu et al. |
| 9,648,034 B2 | 5/2017 | Bailey et al. |
| 9,709,980 B2 | 7/2017 | Bonissone et al. |
| 9,734,001 B2 | 8/2017 | Das et al. |
| 9,747,183 B2 | 8/2017 | Bhattacharya et al. |
| 9,909,445 B2 | 3/2018 | Penda et al. |
| 9,933,338 B2 | 4/2018 | Noda et al. |
| 10,032,321 B2 | 7/2018 | Lacaille |
| 10,035,609 B2 | 7/2018 | Ziarno |
| 10,088,839 B2 | 10/2018 | Saravanapriyan et al. |
| 10,094,740 B2 | 10/2018 | Gouby et al. |
| 10,113,443 B2 | 10/2018 | Masuda et al. |
| 10,384,808 B2 | 8/2019 | Bewlay et al. |
| 10,410,132 B2 | 9/2019 | Rastogi |
| 2004/0243636 A1 | 12/2004 | Hasiewicz et al. |
| 2006/0265713 A1* | 11/2006 | Depro .................... G06Q 50/06 718/104 |
| 2010/0179941 A1* | 7/2010 | Agrawal ............... G06F 16/184 707/639 |
| 2015/0106313 A1* | 4/2015 | Eklund .................... G06N 3/02 706/21 |
| 2015/0346066 A1 | 12/2015 | Dutta et al. |
| 2016/0330225 A1 | 11/2016 | Kroyzer et al. |
| 2016/0371600 A1 | 12/2016 | Svensen et al. |
| 2017/0076216 A1 | 3/2017 | Akrotirianakis et al. |
| 2017/0262520 A1* | 9/2017 | Mitkar .................. G06F 16/275 |
| 2017/0277995 A1 | 9/2017 | Giering et al. |
| 2017/0353477 A1 | 12/2017 | Faigon et al. |
| 2018/0170580 A1 | 6/2018 | Gouby et al. |
| 2018/0297718 A1 | 10/2018 | Adibhatla |
| 2020/0110624 A1* | 4/2020 | Isdal .................. G06F 9/45504 |

FOREIGN PATENT DOCUMENTS

| | | | |
|---|---|---|---|
| CN | 102801767 A | 11/2012 | |
| CN | 103020438 A | 4/2013 | |
| EP | 3255588 A1 | 12/2017 | |
| GB | 2514980 A | 12/2014 | |
| GB | 2541510 A | 2/2017 | |
| JP | 2010254296 A | 11/2010 | |
| JP | 2017021790 A | 1/2017 | |
| KR | 101776350 B1 | 9/2017 | |
| WO | WO 2013184894 A1 * | 12/2013 | ......... G05B 23/0213 |
| WO | WO2016/053748 A1 | 4/2016 | |

* cited by examiner

400

402 — RECEIVING, BY ONE OR MORE PROCESSORS OF A SYSTEM, CONTINUOUS OPERATING DATA ASSOCIATED WITH AN ASSET, THE CONTINUOUS OPERATING DATA INCLUDING PARAMETER VALUES FOR ONE OR MORE PARAMETERS OVER A COLLECTION TIME PERIOD

404 — GENERATING, BY THE ONE OR MORE PROCESSORS, SYNTHETIC SNAPSHOT DATA BASED AT LEAST IN PART ON THE CONTINUOUS OPERATING DATA, THE SYNTHETIC SNAPSHOT DATA INCLUDING ONE OR MORE SYNTHETIC SNAPSHOTS EACH CONTAINING THE PARAMETER VALUES FOR THE ONE OR MORE PARAMETERS FOR A GIVEN TIMEPOINT WITHIN THE COLLECTION TIME PERIOD

406 — RECEIVING, BY THE ONE OR MORE PROCESSORS, SNAPSHOT DATA ASSOCIATED WITH THE ASSET, THE SNAPSHOT DATA INCLUDING ONE OR MORE SNAPSHOTS EACH CONTAINING PARAMETER VALUES FOR THE ONE OR MORE PARAMETERS FOR A GIVEN TIMEPOINT

408 — GENERATING, BY THE ONE OR MORE PROCESSORS, AN OUTPUT INDICATING A HEALTH STATUS OF THE ASSET OR ONE OR MORE COMPONENTS THEREOF BASED AT LEAST IN PART ON THE SNAPSHOT DATA AND THE SYNTHETIC SNAPSHOT DATA

FIG. 11

SYSTEM AND METHOD FOR MONITORING AND DIAGNOSIS OF ENGINE HEALTH USING A SNAPSHOT-CEOD BASED APPROACH

FIELD

The present subject matter relates generally to systems and methods of monitoring and diagnosing engine health.

BACKGROUND

Entities desire that their assets operate optimally while on-line, that they are off-line as little time as possible, that all repair/refurbishment is scheduled (no unscheduled events/maintenance), and that failure events are avoided. For instance, operators of aircraft desire that their engines operate at high efficiency and performance, spend as little time as possible off wing or offboard, that all repairs and service visits are scheduled, and that significant failure events of engine components are avoided. Knowing the health state of an engine and/or one or more components thereof can facilitate accomplishing these goals.

Understanding the health state of an engine and/or one or more components thereof can present a number of challenges. For instance, aviation gas turbine engines typically have limited onboard sensors to measure or sense values for parameters that can indicate an engine/component health state. Conventionally, the health state of an engine and/or a component thereof has been based on a limited number of snapshots of data captured at various timepoints during operation of the engine. Each snapshot includes captured values for various parameters. The captured parameter values are fed into a health state module and the output is the health state of the engine and/or one or more components thereof. While the health state of conventional modules can provide insight into an engine's health state, the health state may only be based on only a limited number of snapshots. This limited number of snapshots may not provide the level of granularity required to reduce unscheduled engine removals (UER) and significant events and plan/target repair/maintenance for engine health issues to maximize Time-On-Wing (TOW).

Accordingly, systems and methods that address one or more of the challenges noted above would be useful.

BRIEF DESCRIPTION

Aspects of the present disclosure are directed to distributed control systems and methods of controlling turbomachines. Aspects and advantages of the invention will be set forth in part in the following description, or may be obvious from the description, or may be learned through practice of the invention.

In one aspect, a system is provided. The system includes one or more memory devices and one or more processors. The one or more processors are configured to: receive continuous operating data associated with an asset, the continuous operating data including parameter values for one or more parameters over a collection time period; generate synthetic snapshot data based at least in part on the continuous operating data, the synthetic snapshot data including one or more synthetic snapshots each containing the parameter values for the one or more parameters for a given timepoint within the collection time period; receive snapshot data associated with the asset, the snapshot data including one or more snapshots each containing parameter values for the one or more parameters for a given timepoint during operation of the asset; and generate an output indicating a health status of the asset or one or more components thereof based at least in part on the snapshot data and the synthetic snapshot data.

In another aspect, a method is provided. The method includes receiving, by one or more processors of a system, continuous operating data associated with an asset, the continuous operating data including parameter values for one or more parameters over a collection time period. In addition, the method includes generating, by the one or more processors, synthetic snapshot data based at least in part on the continuous operating data, the synthetic snapshot data including one or more synthetic snapshots each containing the parameter values for the one or more parameters for a given timepoint within the collection time period. Further, the method includes receiving, by the one or more processors, snapshot data associated with the asset, the snapshot data including one or more snapshots each containing parameter values for the one or more parameters for a given timepoint during operation of the asset. The method also includes generating, by the one or more processors, an output indicating a health status of the asset or one or more components thereof based at least in part on the snapshot data and the synthetic snapshot data.

In a further aspect, a method is provided. The method includes receiving, by one or more processors of a system, continuous engine operating data associated with an aviation gas turbine engine, the continuous engine operating data including parameter values for one or more parameters over a collection time period. The method also includes generating, by the one or more processors, synthetic snapshot data based at least in part on the continuous engine operating data, the synthetic snapshot data including one or more synthetic snapshots each containing the parameter values for the one or more parameters for a given timepoint within the collection time period. The method further includes creating, by the one or more processors, one or more new snapshots by applying a machine-learned model that utilizes one or more COD-snapshot transfer functions that correlate the one or more synthetic snapshots with historical snapshot data associated with the aviation gas turbine engine. In addition, the method includes receiving, by the one or more processors, snapshot data associated with the gas turbine engine, the snapshot data including one or more snapshots each containing parameter values for the one or more parameters for a given timepoint within the collection time period. Further, the method includes adding, by the one or more processors, the one or more new snapshots to the snapshot data. The method also includes generating, by the one or more processors, an output indicating a health status of the aviation gas turbine engine or one or more components thereof based at least in part on the one or more snapshots, new snapshots, and synthetic snapshots.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 11 provides a flow diagram of an example method of monitoring and diagnosing the health of an asset according to one example embodiment of the present subject matter.

DETAILED DESCRIPTION

Figure 1:
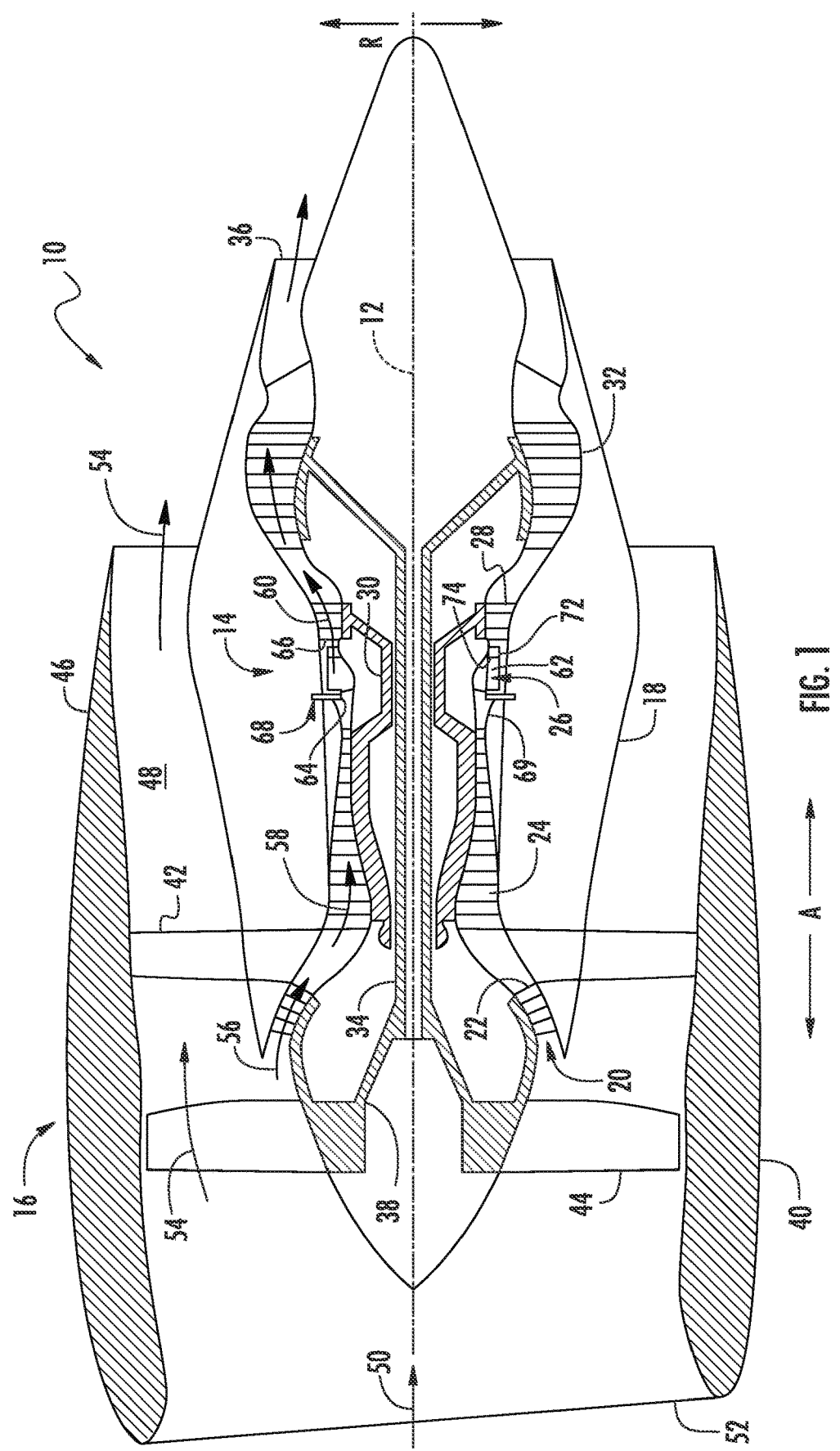
FIG. 1 provides a schematic cross-sectional view of an aviation gas turbine engine according to one example embodiment of the present subject matter.

Reference will now be made in detail to present embodiments of the invention, one or more examples of which are illustrated in the accompanying drawings. The detailed description uses numerical and letter designations to refer to features in the drawings. Like or similar designations in the drawings and description have been used to refer to like or similar parts of the invention. As used herein, the terms "first", "second", and "third" may be used interchangeably to distinguish one component from another and are not intended to signify location or importance of the individual components. The terms "upstream" and "downstream" refer to the relative flow direction with respect to fluid flow in a fluid pathway. For example, "upstream" refers to the flow direction from which the fluid flows, and "downstream" refers to the flow direction to which the fluid flows.

Aspects of the present disclosure are directed to a system and method for monitoring and diagnosis of the health of an asset, such as an aviation gas turbine engine. The systems and methods provided herein utilize a snapshot-continuous operating data based approach to determine the health status of an asset. Conventionally, continuous operating data has not been utilized to generate health estimates.

During operation of an asset, two types of data are captured, including snapshot data and Continuous Operating Data (COD). Snapshot data is captured at various timepoints during operation of the asset. That is, at a particular point in time, a "snapshot" of the operating conditions of the asset are captured. A snapshot includes values for various parameters at a particular point in time during operation of the asset. Continuous operating data is captured continuously during operation of the asset. Particularly, continuous operating data can be collected during a collection time period, e.g., from the start to the end of a flight. The continuous operating data can include a vast amount of data that includes captured values for various parameters over the collection time period. One or more sensors associated with the asset can sense or measure the values for the parameters of both types of data.

In one aspect, a system receives the continuous operating data associated with the asset. The continuous operating data includes parameter values for parameters over the collection time period. The system generates synthetic snapshot data based at least in part on the continuous operating data. The synthetic snapshot data includes one or more synthetic snapshots each containing the parameter values for the one or more parameters for a given timepoint within the collection time period. In some embodiments, the system creates one or more new snapshots by applying a machine-learned model that utilizes one or more COD-snapshot transfer functions that correlate the one or more synthetic snapshots with historical snapshot data associated with the aviation gas turbine engine. In some embodiments, the system can create one or more new snapshots by applying a set of rules. In addition to receiving continuous operating data, the system also receives snapshot data associated with the gas turbine engine, the snapshot data including one or more snapshots each containing parameter values for the one or more parameters for a given timepoint within the collection time period. The system adds the one or more new snapshots to the snapshot data.

The system applies one or more time-series pattern recognition techniques to the snapshot data to determine at least one alert score associated with the snapshot data. The alert score(s) associated with the snapshot data are determined based at least in part on one or more detected features associated with the parameter values for the one or more parameters of the snapshot data. Further, the system applies one or more time-series pattern recognition techniques to the synthetic snapshot data to determine at least one alert score associated with the synthetic snapshot data. The alert score (s) associated with the synthetic snapshot data are determined based at least in part on one or more detected features associated with the parameter values for the one or more parameters of the synthetic snapshot data. The system aggregates the at least one alert score associated with the snapshot data and the at least one alert score associated with the synthetic snapshot data via a probabilistic aggregation technique into an aggregated alert score. The system generates an output indicating a health status of the asset or one or more components thereof based at least in part on the one or more snapshots, new snapshots, and synthetic snapshots, or more particularly, based at least in part on the aggregated alert score. In this way, the output indicating the health status of the asset is based on both received snapshot data and received COD data.

FIG. 1 provides a schematic cross-sectional view of an aviation gas turbine engine according to one example embodiment of the present subject matter. Particularly, FIG. 1 provides an aviation high-bypass turbofan engine herein referred to as "turbofan 10". The turbofan 10 of FIG. 1 can be mounted to an aerial vehicle, such as a fixed-wing aircraft, and can produce thrust for propulsion of the aerial vehicle. For reference, the turbofan 10 defines an axial direction A, a radial direction R, and a circumferential direction. Moreover, the turbofan 10 defines an axial centerline or longitudinal axis 12 that extends along the axial direction A for reference purposes. In general, the axial direction A extends parallel to the longitudinal axis 12, the radial direction R extends outward from and inward to the longitudinal axis 12 in a direction orthogonal to the axial direction A, and the circumferential direction extends three hundred sixty degrees (360°) around the longitudinal axis 12.

The turbofan 10 includes a core gas turbine engine 14 and a fan section 16 positioned upstream thereof. The core engine 14 includes a tubular outer casing 18 that defines an annular core inlet 20. The outer casing 18 further encloses and supports a booster or low pressure compressor 22 for pressurizing the air that enters core engine 14 through core inlet 20. A high pressure, multi-stage, axial-flow compressor 24 receives pressurized air from the LP compressor 22 and further increases the pressure of the air. The pressurized air stream flows downstream to a combustor 26 where fuel is injected into the pressurized air stream and ignited to raise the temperature and energy level of the pressurized air. The high energy combustion products flow from the combustor 26 downstream to a high pressure turbine 28 for driving the high pressure compressor 24 through a high pressure spool 30 or a second rotatable component. The high energy combustion products then flow to a low pressure turbine 32 for driving the LP compressor 22 and the fan section 16 through a low pressure spool 34 or a first rotatable component. The LP spool 34 is coaxial with the HP spool 30 in this example embodiment. After driving each of the turbines 28 and 32, the combustion products exit the core engine 14 through an exhaust nozzle 36 to produce propulsive thrust.

The fan section 16 includes a rotatable, axial-flow fan rotor 38 that is surrounded by an annular fan casing 40. The fan casing 40 is supported by the core engine 14 by a plurality of substantially radially-extending, circumferentially-spaced outlet guide vanes 42. In this way, the fan casing 40 encloses the fan rotor 38 and a plurality of fan blades 44. A downstream section 46 of the fan casing 40 extends over an outer portion of the core engine 14 to define a bypass passage 48. Air that passes through the bypass passage 48 provides propulsive thrust as will be explained further below. In some alternative embodiments, the LP spool 34 may be connected to the fan rotor 38 via a speed reduction device, such as a reduction gear gearbox in an indirect-drive or geared-drive configuration. Such speed reduction devices can be included between any suitable shafts/spools within the turbofan 10 as desired or required.

During operation of the turbofan 10, an initial or incoming airflow, represented by arrow 50, enters the turbofan 10 through an inlet 52 defined by the fan casing 40. The airflow 50 passes through the fan blades 44 and splits into a first air flow (represented by arrow 54) that moves through the bypass passage 48 and a second air flow (represented by arrow 56) which enters the LP compressor 22 through the core inlet 20.

The pressure of the second airflow 56 is progressively increased by the LP compressor 22 and then enters the HP compressor 24, as represented by arrow 58. The discharged pressurized air stream flows downstream to the combustor 26 where fuel is introduced to generate combustion gases or products. The combustion products 60 exit the combustor 26 and flow through the HP turbine 28. The combustion products 60 then flow through the LP turbine 32 and exit the exhaust nozzle 36 to produce thrust. Moreover, as noted above, a portion of the incoming airflow 50 flows through the bypass passage 48 and through an exit nozzle defined between the fan casing 40 and the outer casing 18 at the downstream section 46 of the fan casing 40. In this way, substantial propulsive thrust is produced.

As further shown in FIG. 1, the combustor 26 defines an annular combustion chamber 62 that is generally coaxial with the longitudinal centerline axis 12, as well as an inlet 64 and an outlet 66. The combustor 26 receives an annular stream of pressurized air from a high pressure compressor discharge outlet 69. A portion of this compressor discharge air ("CDP" air) flows into a mixer (not shown). Fuel is injected from a fuel nozzle 68 to mix with the air and form a fuel-air mixture that is provided to the combustion chamber 62 for combustion. Ignition of the fuel-air mixture is accomplished by a suitable igniter, and the resulting combustion gases 60 flow in an axial direction A toward and into an annular, first stage turbine nozzle 72. The nozzle 72 is defined by an annular flow channel that includes a plurality of radially-extending, circumferentially-spaced nozzle vanes 74 that turn the gases so that they flow angularly and impinge upon the first stage turbine blades of the HP turbine 28. For this embodiment, the HP turbine 28 rotates the HP compressor 24 via the HP spool 30 and the LP turbine 32 drives the LP compressor 22 and the fan rotor 38 via the LP spool 34.

Although turbofan 10 has been described and illustrated in FIG. 1 as representing an example gas turbine engine, the subject matter of the present disclosure may apply to other suitable types of engines and turbomachines. For instance, the subject matter of the present disclosure may apply to or be incorporated with other suitable turbine engines, such as steam and other gas turbine engines. Example gas turbine engines may include, without limitation, turbojets, turboprop, turboshaft, aeroderivatives, auxiliary power units, etc. Further, as will be explained below, a gas turbine engine, such as the turbofan 10, is one example of an asset that can be monitored and diagnosed by the systems and methods described herein.

Figure 2:
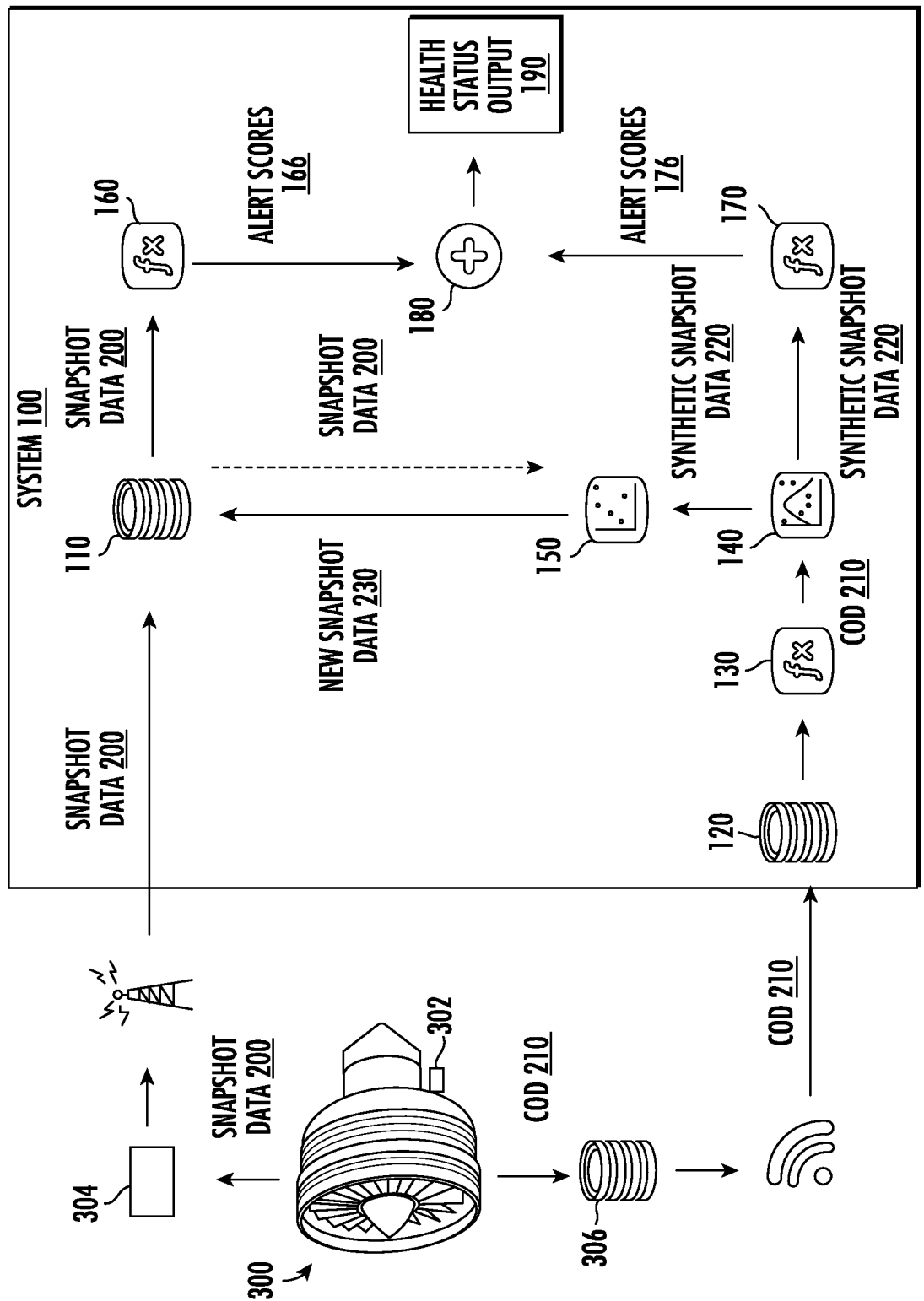
FIG. 2 provides a block diagram of a system according to one example embodiment of the present subject matter.

FIG. 2 provides a block diagram of a system 100 according to one example embodiment of the present subject matter. The system 100 is operable to monitor and diagnose the health of an asset 300 or many assets. In the depicted embodiment of FIG. 2, the asset 300 is the turbofan 10 of FIG. 1. It will be appreciated, however, that the system 100 can be utilized to monitor and diagnose the health of other assets, such as any suitable machine, device, system, etc. for which health monitoring is desirable. As one example, the asset can be the landing gear of an aircraft. As another example, the asset can be the main rotor of a rotary aircraft. As yet another example, the asset can be a drill bit of a drillstring for oil and gas exploration. These examples are not intended to be limiting; other examples are contemplated.

The asset 300 can include one or more associated sensors 302 for measuring or sensing the operating conditions of the asset 300, e.g., during operation of the asset 300. Particularly, the sensors 302 can measure or sense values for one or more parameters indicative of the operating conditions of the asset 300. Example parameters that may be recorded for a gas turbine engine include, without limitation, the low pressure spool speed N1, the high pressure or core spool speed N2, the compressor inlet pressure and temperature P2, T2, respectively, the compressor discharge pressure P3, and/or the temperature at the inlet or outlet of the combustor, T3 and T45, respectively. Other example parameters may include the altitude, air speed, ambient temperature, weather conditions, etc. Values for other parameters can be sensed as well.

Generally, two types of data are captured by the one or more sensors 302 of the asset 300, including snapshot data and continuous operating data (COD). COD is also referred to as continuous engine operating data (CEOD) in the aviation gas turbine engine field. The two data types will be further explained below.

Figure 3:
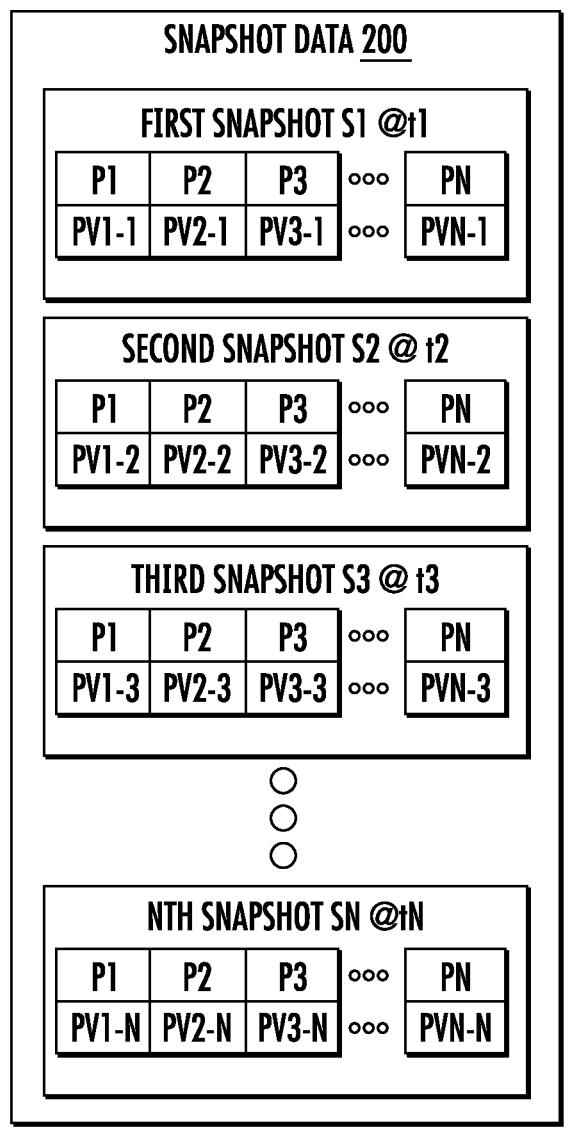
FIG. 3 provides a block diagram of snapshot data according to one example embodiment of the present subject matter.
Figure 4:
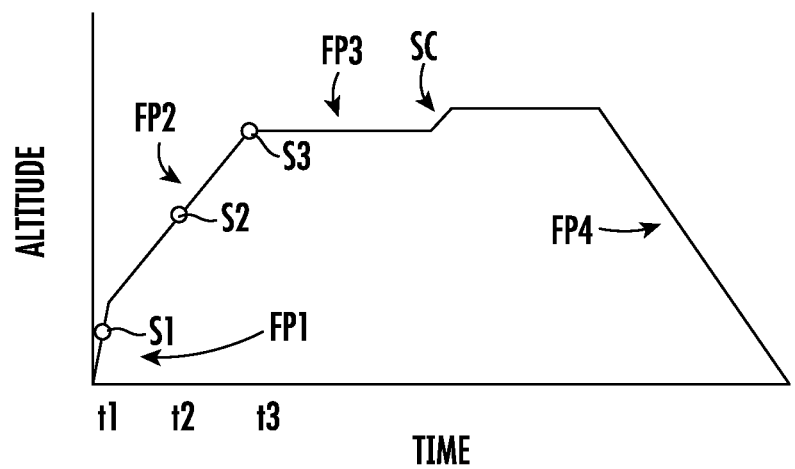
FIG. 4 provides a graph depicting the altitude of an aircraft to which the asset is mounted during a flight as a function of time and also illustrates snapshots captured during the flight, wherein the snapshots are part of the snapshot data of FIG. 3.

Generally, the snapshot data includes one or more snapshots or snapshots of data captured at a given point in time, or "timepoint." Each snapshot contains parameter values for one or more parameters for a given timepoint. For instance, with reference to FIGS. 3 and 4, FIG. 3 provides a block diagram of snapshot data 200 according to one example embodiment of the present subject matter. FIG. 4 provides a graph depicting the altitude of an aircraft to which the asset 300 is mounted during a flight as a function of time. FIG. 4 also illustrates snapshots captured during the flight, wherein the snapshots are part of the snapshot data 200 of FIG. 3. As shown, various snapshots are captured during operation of the asset 300. Particularly, the snapshot data 200 includes a first snapshot S1 captured at time t1, a second snapshot S2 captured at time t2, and a third snapshot S3 captured at time t3. It will be appreciated that the snapshot data 200 can include other snapshots of data as well, denoted by the Nth snapshot captured at time tN. The snapshot data 200 can include any suitable number of snapshots. As used herein, N denotes any suitable integer.

Each snapshot S1, S2, S3, SN includes parameter values for one or more parameters for a given timepoint. For instance, the first snapshot S1 captured at time t1 includes parameter values PV1-1, PV2-1, PV3-1, PVN-1 that correspond to a first parameter P1, a second parameter P2, a third parameter P3, and an Nth parameter, respectively. All of the parameter values for the first snapshot S1 are captured at time t1. Likewise, the second snapshot S2 captured at time t2 includes parameter values PV1-2, PV2-2, PV3-2, PVN-2 that correspond to the first, second, third, and Nth parameters P1, P2, P3, PN, respectively. All of the parameter values for the second snapshot S2 are captured at time t2. Further, the third snapshot S3 captured at time t3 includes parameter values PV1-3, PV2-3, PV3-3, PVN-3 that correspond to the first, second, third, and Nth parameters P1, P2, P3, PN, respectively. All of the parameter values for the third snapshot S3 are captured at time t3. Other snapshots can include parameter values for the parameters as well, as represented in the Nth snapshot.

Snapshots can be captured based upon a trigger condition. As one example, snapshots can be captured at a predetermined time interval. As another example, snapshots can be captured when the aircraft to which the asset 300 is mounted reaches a predetermined altitude. For instance, as shown in FIG. 4, the aircraft operates in various flight phases (FP), including takeoff FP1, climb FP2, cruise FP3, and descent and landing FP4. As shown, the predetermined altitudes are set in this example such that the first snapshot S1 is captured during takeoff FP1, the second snapshot S2 is captured during climb FP2, and the third snapshot S3 is captured during the cruise FP3. As noted above, other snapshots can be captured. For example, a snapshot can be captured after the aircraft performs a step climb SC while in cruise FP3 or when the aircraft reaches a predetermined altitude a second time, such as at some point during descent and landing FP4. To summarize, the snapshot data 200 includes one or more snapshots of data that each capture the operating conditions of the asset 300 or some component thereof at a given timepoint.

Returning to FIG. 2, as depicted, the asset 300 can include or be associated with a communication unit 304. Sensed snapshots or snapshot data can be routed to the communication unit 304. The communication unit 304 can be a digital data link system or communications management unit (CMU) of an aircraft to which the asset 300 is mounted. Accordingly, in some embodiments, the communication unit 304 can be an Aircraft Communications, Addressing and Reporting System (ACARS), for example. The communication unit 304 can be mounted directly to the asset 300 or can be positioned remote from the asset 300, e.g., within with the fuselage of the aircraft to which the asset 300 is mounted. The communication unit 304 can include one or more processors, one or memory devices, and a communication interface for communicating messages, alerts, etc. to a remote station. As one example, the snapshot data can be received and stored by the communication unit 304. The communication unit 304 can then transmit the snapshot data to a remote station, such as a ground station or another aircraft. The snapshot data can be transmitted to the remote station using any suitable transmission technique and protocol. As will be explained further herein, the system 100 can receive the snapshot data and make health assessments of the asset 300 based on the received snapshot data.

In addition to the snapshot data, the one or more sensors 302 of the asset 300 can capture COD, or in this example, CEOD. Generally, as the name implies, COD is captured continuously over a time period, e.g., a COD collection time period spanning from a start point to an endpoint. The COD includes parameter values captured for one or more parameters over the time period. Values for parameters can be captured at different capture rates, e.g., once every millisecond, once every second, once every three seconds, etc. The parameter values for the parameters are captured in frames or capture frames.

Figure 5:
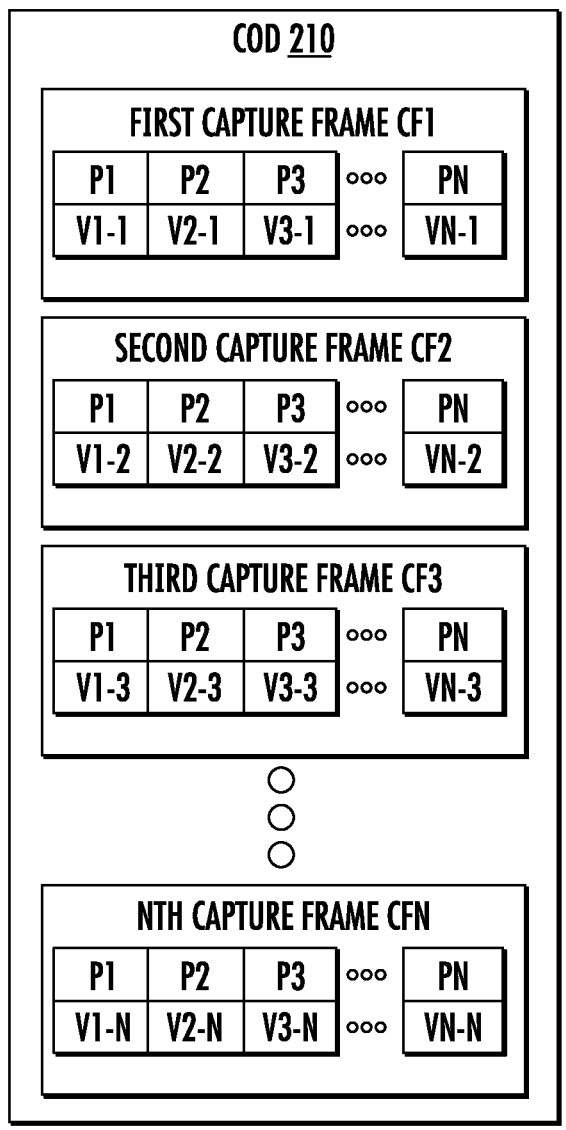
FIG. 5 provides a block diagram of continuous operating data (COD) according to one example embodiment of the present subject matter.
Figure 6:
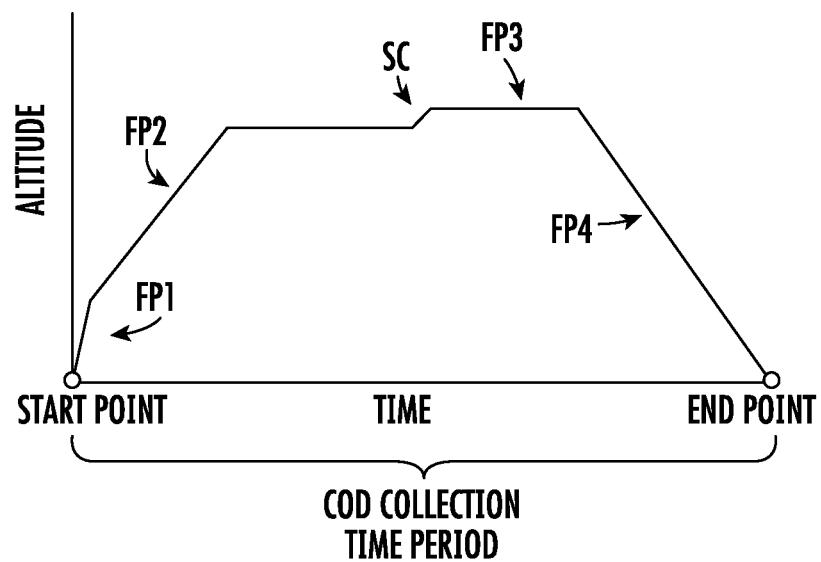
FIG. 6 provides a graph depicting the altitude of the aircraft to which the asset is mounted during the flight of FIG. 4 as a function of time and also illustrates the time period over which the COD of FIG. 5 is captured.

For instance, with reference to FIGS. 5 and 6, FIG. 5 provides a block diagram of COD 210 according to one example embodiment of the present subject matter. FIG. 6 provides a graph depicting the altitude of the aircraft to which the asset 300 is mounted during flight as a function of time. FIG. 6 also illustrates the time period over which the COD of FIG. 5 is captured. As shown in FIG. 5, the COD 210 includes time-sequential capture frames, including a first capture frame CF1, a second capture frame CF2, a third capture frame CF3, and so on to the Nth capture frame CFN. The COD 210 can include any suitable number of capture frames.

Each capture frame CF1, CF2, CF3, CFN of the COD 210 includes parameter values captured for one or more parameters. For instance, the first capture frame CF1 has captured parameter values V1-1, V2-1, V3-1, VN-1 that correspond to the first parameter P1, the second parameter P2, the third parameter P3, and the Nth parameter, respectively. As the asset continues to operate, additional capture frames of parameter values are captured. Particularly, the second capture frame CF2 has captured parameter values V1-2, V2-2, V3-2, VN-2 that correspond to the first, second, third, and Nth parameters P1, P2, P3, PN, respectively. Moreover, the third capture frame CF3 has captured parameter values V1-3, V2-3, V3-3, VN-3 that correspond to the first, second, third, and Nth parameters P1, P2, P3, PN, respectively. As will be appreciated, the COD 210 can include many more captured frames of data than shown in FIG. 5 as represented by the Nth capture frame. Some of the parameters for which values are captured for the snapshot data and the parameters for which values are captured for the COD data can be the same or overlap. Accordingly, some of the values captured for the snapshot data and the values captured for the COD data can be the same or overlap.

COD 210 can be captured over a period of time as noted above. The COD collection time period can span between a start point and an end point. As shown in FIG. 6, in some embodiments, the start point can correspond with a time at or before takeoff of the aircraft to which the asset 300 is mounted. The COD 210 can commence being sensed and recorded upon power up or spooling up of the asset 300, while taxiing for takeoff, or at another suitable point in time, e.g., just before or just after takeoff. COD 210 can be continuously sensed and recorded for an entire flight or part of a flight as desired. For the depicted flight in FIG. 6, the COD 210 is sensed and recorded from the start point, which occurs prior to takeoff, to the end point, which occurs after the aircraft has landed.

Returning again to FIG. 2, the asset 300 can include or be associated with a recorder 306 that records the COD 210. For instance, an engine monitoring unit or "black box" of a vehicle to which the asset 300 is mounted can record the sensed COD 210. The sensed COD 210 can be stored in one or more memory devices of the recorder 306. The recorder 306 can be mounted to the asset 300 (e.g., to or under a cowling) or can be positioned remote from the asset 300 (e.g., in an avionics bay of an aircraft to which the asset 300 is mounted). Once recorded and stored in the recorder 306, the COD 210 is transmitted, routed, or otherwise moved to a remote station, e.g., by wired communication links, wirelessly, or by some other method. The COD 210 can be moved to the remote station automatically or manually. The COD 210 can be transmitted to the remote station using any suitable transmission technique and protocol. As will be explained further herein, the system 100 can receive the COD 210 in addition to the snapshot data and make health assessments associated with the asset 300 based on the received snapshot data and the COD data.

The system 100 will now be described in detail. Generally, as noted above, the system 100 is operable to monitor and diagnose the health of the asset 300 or components thereof. The system 100 can include one or more processing devices and one or more memory devices, e.g., embodied in one or more computing devices and data stores. The one or more memory devices can store data and instructions accessible by the one or more processors, including computer-readable instructions that can be executed by the one or more processors. The instructions can be any set of instructions that, when executed by the one or more processors, cause the one or more processors to perform operations, such as the operations described herein for monitoring and diagnosing the health of the asset 300.

As shown in FIG. 2, the system 100 receives the snapshot data 200 associated with the asset 300. The received snapshot data 200 is stored in a data store, such as snapshot data store 110. In addition, the system 100 receives the COD 210 associated with the asset 300. The received COD 210 is stored in a data store, such as COD data store 120. With the COD 210 stored, the COD 210 is accessed and at parameter calculation module 130, the one or more processors of the system 100 determine one or more values for additional parameters associated with the asset 300 based at least in part on the COD 210. By way of example, as noted, the COD 210 can include sensed parameter values for various parameters, such as pressures and temperatures at different stations of the engine, ambient temperature, shaft spool speed, etc. The sensed values for these parameters can be utilized to calculate or determine values for other parameters associated with the asset 300. For example, parameter values for parameters such as exhaust gas temperature (EGT), engine pressure ratios, stall margin, various mass flows, various efficiencies, etc. can be determined based at least in part on the sensed values. Calculated parameter values can be useful for monitoring and assessing the health of the asset 300. The calculated values for the parameters can be added to or otherwise included in the COD 210.

Figure 7:
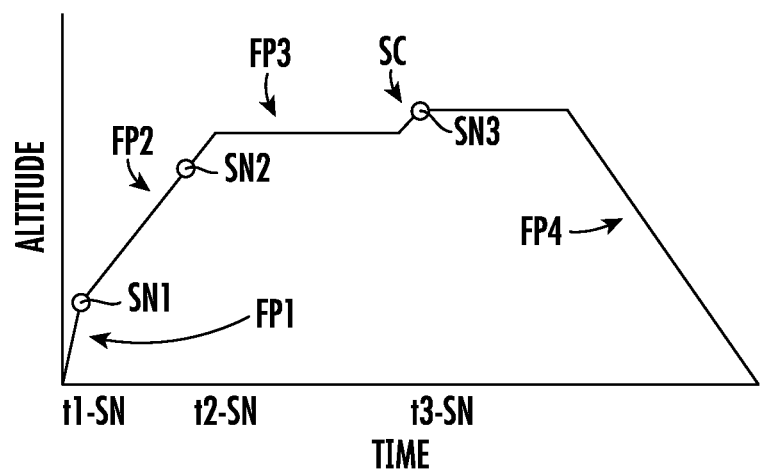
FIG. 7 shows synthetic snapshots generated at various timepoints within the COD collection time period of the flight depicted in FIGS. 4 and 6.

At a synthetic snapshot generator module 140, the COD 210 that includes the sensed and calculated values for the parameters associated with the asset 300 is processed. Particularly, one or more processing devices of the system 100 can generate synthetic snapshot data 220 based at least in part on the COD 210. The generated synthetic snapshot data can include one or more synthetic snapshots. Each synthetic snapshot can contain sensed and/or calculated parameter values for the one or more parameters for a given timepoint within the time period, i.e., the time period spanning from the start point to the end point of COD collection. For example, FIG. 7 shows synthetic snapshots generated at various timepoints within the COD collection time period. Particularly, a first synthetic snapshot SN1 is generated at a timepoint t1-SN, a second synthetic snapshot SN2 is generated at a timepoint t2-SN, and a third synthetic snapshot SN3 is generated at a timepoint t3-SN. By generating synthetic snapshots, the vast amount of data included in the COD 210 can be broken down into manageable, easier to handle data points that can be used to monitor and diagnose the health of the asset 300 or components thereof.

The synthetic snapshots can be generated for any suitable timepoints within the COD collection time period. As one example, the synthetic snapshots can be generated at timepoints that are spaced in time midway between snapshots captured as part of the snapshot data. As another example, the synthetic snapshots can be generated at timepoints such that there is at least one synthetic snapshot spaced a predetermined time (e.g., 15 seconds) from each snapshot captured as part of the snapshot data. As yet another example, the synthetic snapshots can be generated at timepoints that correspond with a maximum or minimum value for a particular parameter in one, some, or all the flight phases. For instance, one synthetic snapshot can be generated at a timepoint that corresponds with a maximum pressure at the outlet of the compressor of the asset 300 during takeoff, one synthetic snapshot can be generated at a timepoint that corresponds with a maximum pressure at the outlet of the compressor of the asset 300 during climb, one synthetic snapshot can be generated at a timepoint that corresponds with a maximum pressure at the outlet of the compressor of the asset 300 during cruise, and so on for each flight phase. In some embodiments, multiple synthetic snapshots can be generated at timepoints within a given flight phase, some of the flight phases, or all flight phases. For instance, a first synthetic snapshot that corresponds with a maximum or minimum value for a first parameter in a given one of the flight phases can be generated at a first timepoint and a second synthetic snapshot that corresponds with a maximum or minimum value for a second parameter in the same flight phase can be generated at a second timepoint. The synthetic snapshots can be generated at timepoints within the COD collection time period based on other criteria and/or considerations as well.

In some embodiments, one or more of the synthetic snapshots can include parameter values from a single capture frame. In some embodiments, one or more of the synthetic snapshots a given or multiple capture frames in close time-proximity to one another. For example, in some instances, a parameter value for every needed parameter to create a synthetic snapshot is sensed in a given capture frame. To obtain a parameter value for the needed parameter, a parameter value from an adjacent-in-time or closest-in-time capture frame can be utilized to generate the synthetic snapshot.

As shown in FIG. 2, for this embodiment, the generated synthetic snapshot data, which includes the synthetic snapshots, is routed to two modules, including a snapshot creator module 150 and a synthetic health module 170. In some alternative embodiments, the system 100 does not include the snapshot creator module 150. Accordingly, in such alternative embodiments, the synthetic snapshot data is routed to the synthetic health module 170 but not the snapshot creator module 150.

The snapshot creator module 150 is utilized as a feature generation tool. Particularly, the synthetic snapshot data 220 generated at the synthetic snapshot generator module 140 is input into the snapshot creator module 150. The snapshot creator module 150 then creates one or more new snapshots using the synthetic snapshot data 220. The one or more new snapshots can be added to the snapshot data 200 stored in the snapshot data store 110. In this way, the new snapshots can enhance or augment the snapshot data. The increased number of data points may increase the confidence in the health alerts provided by the system 100.

The snapshot creator module 150 creates the new snapshots by applying one or more machine-learned models that utilize one or more COD-snapshot transfer functions that correlate the one or more synthetic snapshots with historical snapshot data associated with the asset. In some embodiments, the historical snapshot data includes the snapshot data received at the snapshot data store 110 for the most recent flight or operation cycle. The snapshot creator module 150 can include instructions, models, functions, etc. The one or more processors of the system 100 can execute the instructions to implement the models, functions, etc. to ultimately create the new snapshots.

Figure 8:
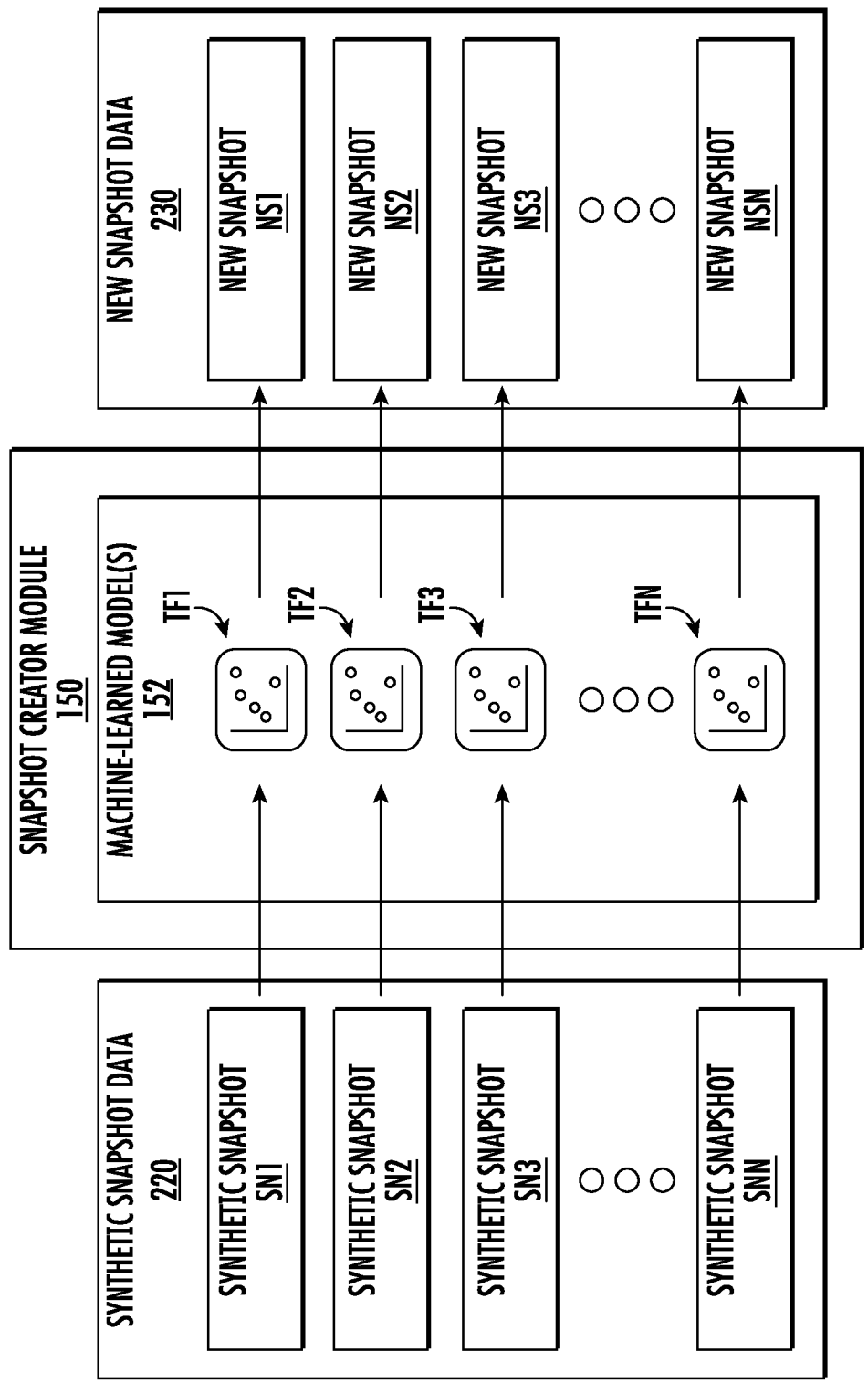
FIG. 8 provides a block diagram depicting a snapshot creator module of the system of FIG. 2 creating new snapshots.

By way of example, FIG. 8 provides a block diagram depicting the snapshot creator module 150 of the system 100 creating new snapshots. As shown, the synthetic snapshot data 220 is input into the snapshot creator module 150. The synthetic snapshot data 220 includes a first synthetic snapshot SN1, a second synthetic snapshot SN2, a third synthetic snapshot SN3, and so on to the Nth synthetic snapshot SNN. As noted above, each synthetic snapshot SN1, SN2, SN3, SNN can include values for parameters for a given timepoint. As depicted in FIG. 8, the synthetic snapshots SN1, SN2, SN3, SNN are fed into a machine-learned model 152. Particularly, the synthetic snapshots SN1, SN2, SN3, SNN are fed into COD-snapshot transfer functions of the machine-learned model 152. In this example, the one or more COD-snapshot transfer functions include a first COD-snapshot transfer function TF1, a second COD-snapshot transfer function TF2, a third COD-snapshot transfer function TF3, and so on to the Nth COD-snapshot transfer function. The one or more COD-snapshot transfer functions TF1, TF2, TF3, TFN correlate the one or more synthetic snapshots SN1, SN2, SN3, SNN with historical snapshot data associated with the asset 300. In this way, the inputs, which in this example are the values for the parameters of the synthetic snapshots SN1, SN2, SN3, SNN, can be utilized by the transfer functions TF1, TF2, TF3, TFN to generate outputs, which in this example is the new snapshot data 230, which includes a first new snapshot NS1, a second new snapshot NS2, a third new snapshot NS3, and so on to the Nth new snapshot NSN.

The machine-learned model 152, or more particularly the COD-transfer functions, can be trained based on historical snapshot data points. The COD-transfer functions can be trained based on COD and snapshot data obtained by the system 100 and can be retrained periodically as new data is obtained. In some instances, the transfer functions can be trained/retrained using snapshot data from a flight from which the COD used to generate the synthetic snapshot data is generated prior to the new data points being created. In this manner, the transfer functions can be trained with the most up-to-date data. In addition, the machine-learned model 152 can be trained based at least in part on the historical snapshot data associated with the asset 300 and fleet historical snapshot data associated with other assets that are a same model as the asset 300. For instance, the fleet historical snapshot data can include snapshot data captured by other aviation gas turbine engines during their respective flights. In some alternative embodiments, the snapshot creator module 150 creates the new snapshots by applying a set of rules rather than on a trained machine-learned model or models.

Returning to FIG. 2, with the new snapshots created, the new snapshots are added to the snapshot data 200 stored in the snapshot data store 110. The snapshot data 200, which includes the snapshots captured by the sensors 302 of the asset 300 or calculated therefrom and the new snapshots created by the snapshot creator module 150, is input into a snapshot health module 160. And as noted above, the synthetic snapshot data 220 generated at the synthetic snapshot generator module 140 is input into the synthetic health module 170. Generally, the snapshot health module 160 and the snapshot health module 160 apply one or more time-series pattern recognition techniques or anomaly detection techniques using their respective received data to output alert scores for various alerts that indicate a health status of the asset 300 or one or more components thereof.

Figure 9:
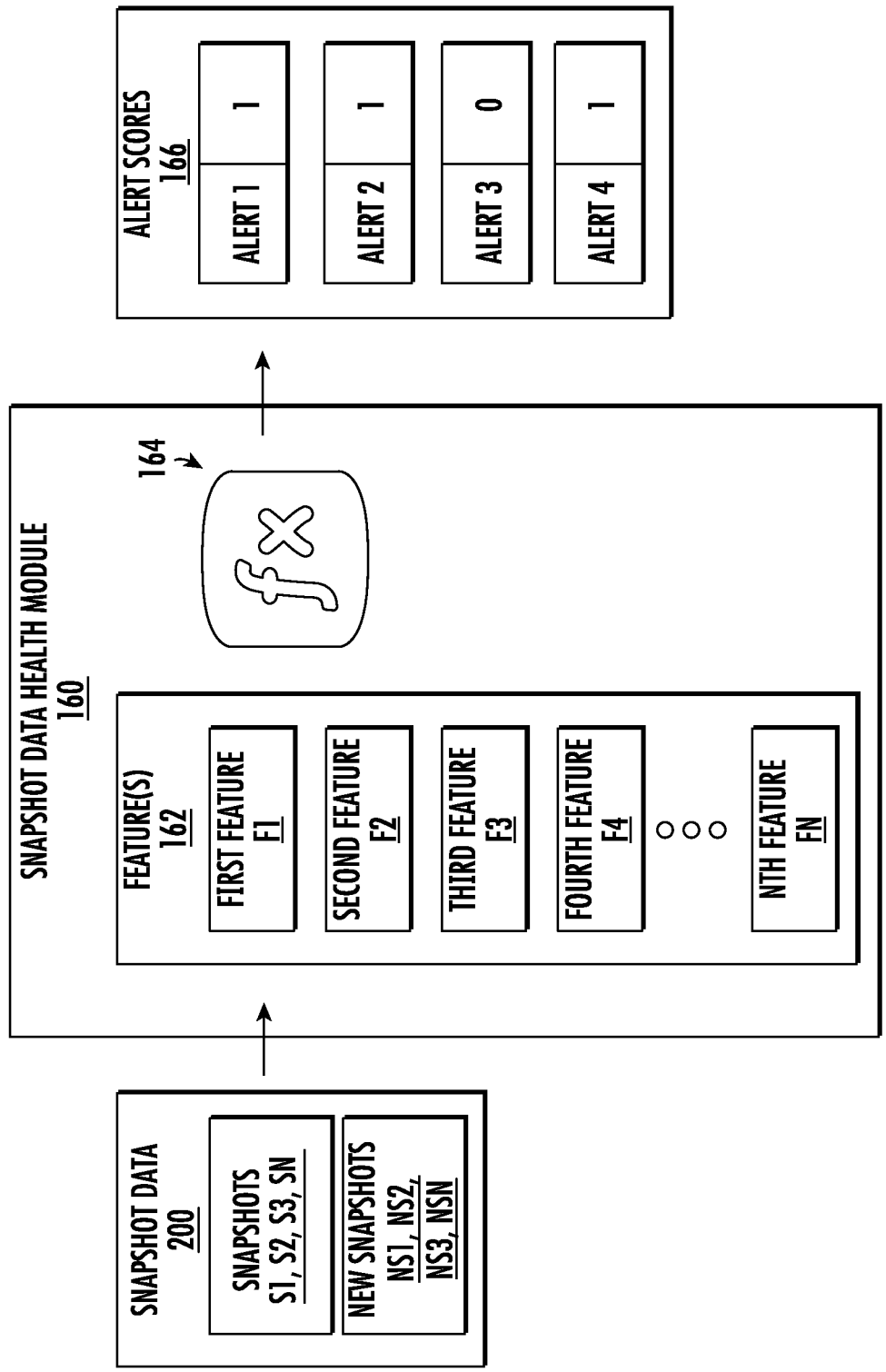
FIG. 9 provides a block diagram depicting the snapshot data health indicator module of the system of FIG. 2 generating alert scores for various alerts that indicate a health status of the asset of FIG. 2 or a component thereof.

By way of example, FIG. 9 provides a block diagram depicting the snapshot health module 160 of the system 100 generating alert scores for various alerts that indicate a health status of the asset 300 or a component thereof. As depicted, the snapshot data 200 is input into the snapshot health module 160. The snapshot data 200 includes the snapshots, e.g., S1, S2, S3, SN as shown in FIG. 3, as well as the new snapshots, e.g., NS1, NS2, NS3, NSN as shown in FIG. 8. The one or more time-series pattern recognition techniques 164 can be applied or utilized to detect certain features in the input snapshot data 200. For example, the one or more time-series pattern recognition techniques 164 can be applied to detect trends, shifts, changes, or otherwise detect anomalies as well as other features in certain sensed or calculated parameter values in the input snapshot data 200. Any suitable number of features can be considered.

For instance, in FIG. 9, the features 162 include a first feature F1, a second feature F2, a third feature F3, a fourth feature F4, and so on to the Nth feature FN. As one example, the first feature F1 can be associated with detecting a shift for a first parameter, the second feature F2 can be associated with detecting a trend for the first parameter, the third feature F3 can be associated with detecting a shift for a second parameter, and the fourth feature F4 can be associated with detecting a trend for the second parameter. Other features can be associated with detecting shifts and/or trends in other parameters of the snapshot data.

One or more time-series pattern recognition techniques 164 or anomaly detection techniques can be applied to detect the features 162 in the received snapshot data 200 as noted above. Particularly, the applied time-series pattern recognition techniques 164 can be used to determine whether a given feature (e.g., a shift or trend associated with a parameter) exceeds a predetermined threshold. The predetermined thresholds can be set or determined based on historical data, for example. The predetermined thresholds can be any suitable types or combinations of thresholds. For instance, the predetermined thresholds can be rate of change thresholds, shift thresholds, maximum and/or minimum value thresholds, trend thresholds, etc.

An alert score for an alert can be generated based at least in part on whether one or more of the features associated with the alert exceed their respective thresholds. One or multiple features can be associated with a given alert. Alert scores can be generated for each alert. In some embodiments, the alert scores can be binary scores. For instance, when the one or more features associated with an alert exceed their respective thresholds, an alert score of "1" can be generated for the alert. When the one or more features associated with the alert do not exceed their respective thresholds, an alert score of "0" can be generated for the alert.

As depicted in FIG. 9, for example, alert scores are generated for four alerts, including a first alert (Alert 1), a second alert (Alert 2), a third alert (Alert 3), and a fourth alert (Alert 4). Although four alerts are shown in FIG. 9, any suitable number of alerts can be considered or have alert scores generated therefore. The alerts can indicate a health status of the asset 300 or a component thereof. As shown, for this example, an alert score of "1" has been output for Alert 1 as its associated features have exceeded their respective thresholds, an alert score of "1" has been output for Alert 2 as its associated features have exceeded their respective thresholds, an alert score of "0" has been output for Alert 3 as its associated features have not exceeded their respective thresholds, and an alert score of "1" has been output for Alert 4 as its associated features have exceeded their respective thresholds. Accordingly, three of the four alerts have output a score of "1" indicating that their respective one or more associated features have exceeded their respective thresholds. The alert scores output for the alerts can be forwarded to an aggregator 180 as shown in FIG. 2.

Figure 10:
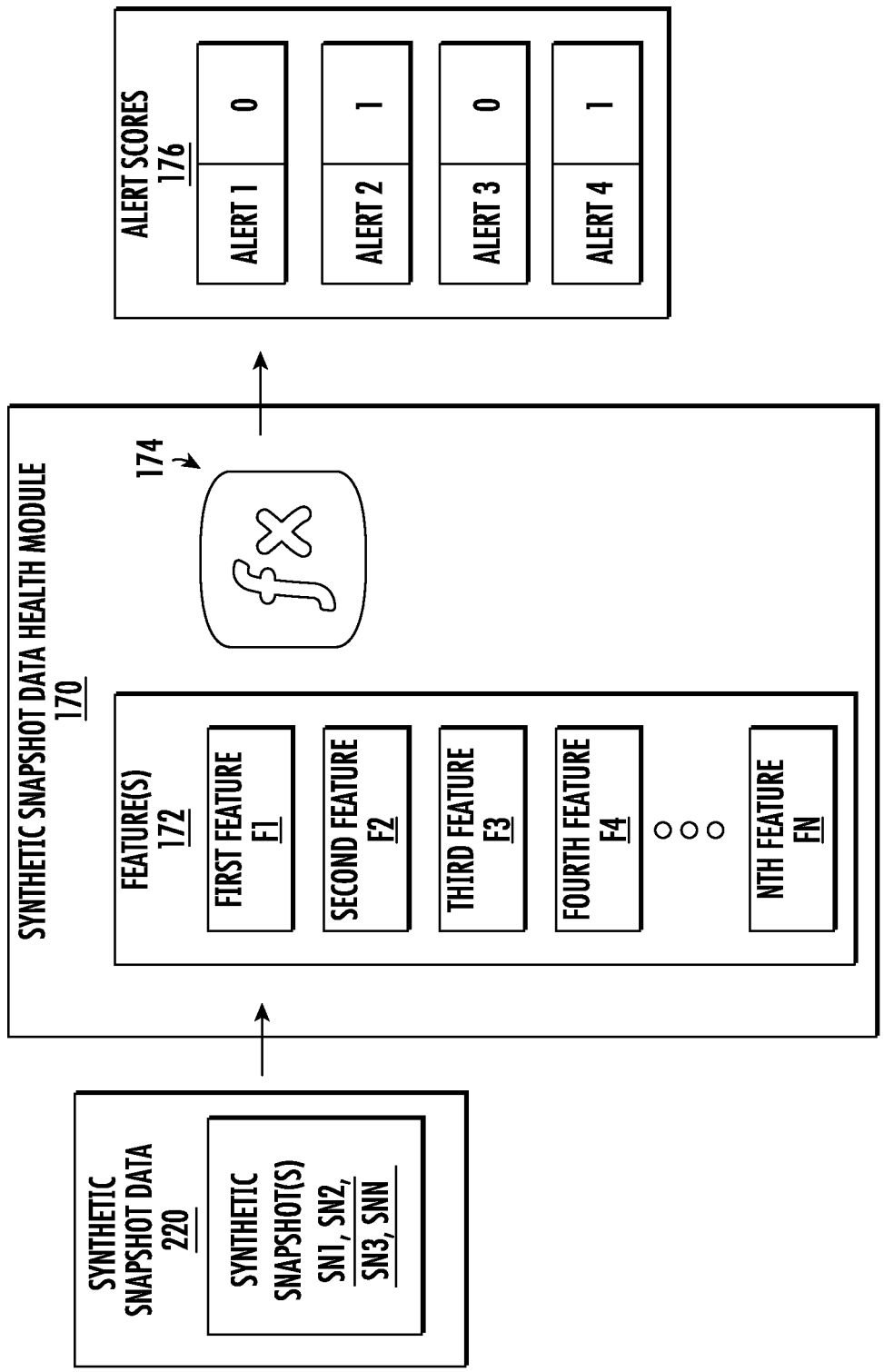
FIG. 10 provides a block diagram depicting the synthetic snapshot data health indicator module of the system of FIG. 2 generating alert scores for various alerts that indicate a health status of the asset of FIG. 2 or a component thereof.

FIG. 10 provides a block diagram depicting the synthetic health module 170 of the system 100 generating alert scores for various alerts that indicate a health status of the asset 300 or a component thereof. As illustrated, the synthetic snapshot data 220 is input into the synthetic health module 170. The synthetic snapshot data 220 includes synthetic snapshots, e.g., SN1, SN2, SN3, SNN as shown in FIG. 8. The one or more time-series pattern recognition techniques 174 can be applied or utilized to detect certain features in the input synthetic snapshot data 220. For example, the one or more time-series pattern recognition techniques 174 can be applied to detect trends, shifts, changes, or otherwise detect anomalies as well as other features in certain sensed or calculated parameter values in the input synthetic snapshot data 220. Any suitable number of features can be considered.

For instance, in FIG. 10, the features 172 include a first feature F1, a second feature F2, a third feature F3, a fourth feature F4, and so on to the Nth feature FN. As one example, the first feature F1 can be associated with detecting a shift for a first parameter, the second feature F2 can be associated with detecting a trend for the first parameter, the third feature F3 can be associated with detecting a shift for a second parameter, and the fourth feature F4 can be associated with detecting a trend for the second parameter. Other features can be associated with detecting shifts and/or trends in other parameters of the snapshot data. The features of the synthetic health module 170 can be the same features as utilized in the snapshot health module 160 of FIG. 9.

One or more time-series pattern recognition techniques 174 or anomaly detection techniques can be applied to detect features 172 in the received synthetic snapshot data 220 as noted above. Specifically, the applied time-series pattern recognition techniques 174 can be used to determine whether a given feature (e.g., a shift or trend associated with a parameter) exceeds a predetermined threshold. The predetermined thresholds can be set or determined based on historical data, for example. The predetermined thresholds can be any suitable types or combinations of thresholds. For instance, the predetermined thresholds can be rate of change thresholds, shift thresholds, maximum and/or minimum value thresholds, trend thresholds, etc. The one or more time-series pattern recognition techniques 174 applied to the features 172 can be the same techniques applied to the features 162 of the snapshot health module 160 as depicted in FIG. 9.

Further, as noted above, an alert score for an alert can be generated based at least in part on whether one or more of the features associated with the alert exceed their respective thresholds. One or more multiple features can be associated with a given alert. Alert scores can be generated for each alert. In some embodiments, the alert scores can be binary scores. For instance, when the one or more features associated with an alert exceed their respective thresholds, an alert score of "1" can be output for the alert. When the one or more features associated with the alert do not exceed their respective thresholds, an alert score of "0" can be output for the alert.

As depicted in FIG. 10, for example, alert scores are generated for four alerts, including a first alert (Alert 1), a second alert (Alert 2), a third alert (Alert 3), and a fourth alert (Alert 4). Although four alerts are shown in FIG. 10, any suitable number of alerts can be considered. The alerts can indicate a health status of the asset 300 or a component thereof. As shown, for this example, an alert score of "0" has been output for Alert 1 as its associated features have not exceeded their respective thresholds, an alert score of "1" has been output for Alert 2 as its associated features have exceeded their respective thresholds, an alert score of "0" has been output for Alert 3 as its associated features have not exceeded their respective thresholds, and an alert score of "1" has been output for Alert 4 as its associated features have exceeded their respective thresholds. Accordingly, two of the four alerts have a score of "1" indicating that their respective one or more associated features have exceeded their respective thresholds and two of the four alerts have a score of "0" indicating that their respective one or more associated features have not exceeded their respective thresholds. The alert scores generated for the alerts can be forwarded to the aggregator 180 as shown in FIG. 2.

As shown in FIG. 2, the aggregator 180 receives the alert scores generated by the snapshot health module 160 and the alert scores generated by the synthetic health module 170. The aggregator 180 can utilize a probabilistic aggregation technique to generate an output indicative of a health status of the asset 300 or a component thereof based at least in part on the alert scores generated by the snapshot health module 160 and the alert scores generated by the synthetic health module 170. Particularly, the aggregator 180 can aggregate the alert scores associated with the snapshot data and the alert scores associated with the synthetic snapshot data via a probabilistic aggregation technique into an aggregated alert score. The output indicating the health status of the asset or one or more components thereof can be generated based at least in part on the aggregated alert score. The aggregator 180 can assign weighted values to alert scores and the output can be generated based on the alert score and the weighted values assigned to the alerts. For instance, one of the alerts can be a prime indicator of health and thus can carry more weight in determining the output. In some embodiments, the aggregator 180 can generate the output indicating the health status as one or more time-trend plots that trend or forecast certain parameters.

The generated output indicative of the health status of the asset 300 can be utilized by the system 100 or some other system to perform a control action. As one example, an electronic engine controller (EEC) of a gas turbine engine (the asset) can control the gas turbine engine based at least in part on the health status of the engine or a component of module thereof (e.g., a compressor). For instance, the EEC can control the gas turbine engine to operate more or less aggressively based on the health status. As another example, a maintenance system can receive the health status and automatically schedule a service visit based at least in part on the outputted health status associated with the asset. Other control actions are contemplated; the examples provided above are not intended to be limiting.

FIG. 11 provides a flow diagram of an example method (400) of monitoring and diagnosing the health of an asset according to one example embodiment of the present subject matter according to an example embodiment of the present subject matter. The method (400) of FIG. 11 can be implemented using, for instance, the system 100 and/or components thereof described herein. FIG. 11 depicts actions performed in a particular order for purposes of illustration and discussion. Those of ordinary skill in the art, using the disclosures provided herein, will understand that various actions disclosed herein can be modified in various ways without deviating from the scope of the present disclosure.

At (402), the method (400) includes receiving, by one or more processors of a system, continuous operating data associated with an asset, the continuous operating data including parameter values for one or more parameters over a collection time period. For instance, the asset can be a gas turbine engine, such as an aviation gas turbine engine. Accordingly, the continuous operating data can be continuous engine operating data, for example. The system can be an engine monitoring and health diagnostic system. The continuous operating data can be collected for a collection time period spanning from a start point to an endpoint, e.g., as shown in FIG. 6. In this way, continuous operating data can be collected for an entire flight. In some instances, continuous operating data can be collected for a portion of a flight. The continuous operating data can be collected continuously during the collection time period. Values for various parameters associated with the engine can be sensed and recorded. For example, a recorder associated with the engine can record values for one or more parameters frame by frame, or stated differently, capture frame by capture frame. Values for parameters can be captured in each frame or at a time interval in different capture frames. FIG. 5 provides an example block diagram of continuous operating data. The system can receive the continuous operating data and can store the continuous operating data in a data store accessible by one or more processors of the system.

In some implementations, the method (400) includes determining, by the one or more processors, one or more values for additional parameters associated with the asset, the one or more values for the additional parameters being determined using the continuous operating data. For instance, as shown in FIG. 2, the continuous operating data stored in COD data store 120 can be accessed and the one or more processors of the system 100 can execute the parameter calculation module 130 to determine one or more values for additional parameters using the continuous operating data. The parameter calculation module 130 can include computer-readable instructions and one or more physics-based models, for example. The one or more values for the additional parameters of the continuous operating data can be used to generate the synthetic snapshot data at (404).

At (404), the method (400) includes generating, by the one or more processors, synthetic snapshot data based at least in part on the continuous operating data, the synthetic snapshot data including one or more synthetic snapshots each containing the parameter values for the one or more parameters for a given timepoint within the collection time period. For instance, synthetic snapshots can be generated at the timepoints shown in FIG. 7. Any suitable number of synthetic snapshots can be generated. The one or more processors can execute the synthetic snapshot generator module 140 (FIG. 2) to generate the synthetic snapshots. By generating synthetic snapshots, the vast amount of data included in the continuous operating data can be broken down into manageable, easier to handle data points that can be used to monitor and diagnose the health of the asset (e.g., an aviation gas turbine engine) or components thereof. In some implementations, at least one of the one or more synthetic snapshots is created at a timepoint within a defined operation phase (e.g., a climb phase of a flight) of the collection time period that corresponds with a maximum or minimum value for a given parameter of the one or more parameters.

At (406), the method (400) includes receiving, by the one or more processors, snapshot data associated with the asset, the snapshot data including one or more snapshots each containing parameter values for the one or more parameters for a given timepoint during operation of the asset. Particularly, for each operation cycle of an asset, one or more sensors associated with the asset can capture a "snapshot" of the operating conditions at particular timepoints or timestamps during operation. Each captured snapshot can include values for various parameters, such as pressures, temperatures, speeds, etc. As one example, the snapshot data can include at least one snapshot in each predefined operating phase of the asset, e.g., at least one snapshot in each flight phase. In some implementations, one, some, or all of the snapshots can be captured during the collection time period in which COD is recorded. In other implementations, one, some, or all of the snapshots can be captured during a time period of operation of the asset that is not during the collection time period. Moreover, in some instances, all of the timepoints associated with the snapshots can be different from the timepoints associated with the synthetic snapshots. In other instances, however, one or more of the synthetic snapshots can correspond in time with one of the snapshots. In this way, a snapshot and a synthetic snapshot can contain parameter values for one or more parameters for the same timepoint. In this regard, in some implementations, the accuracy of the synthetic snapshot, or the synthetic snapshots in general, can be checked against the actual snapshot.

In some implementations, the method (400) includes creating, by the one or more processors, one or more new snapshots by applying a machine-learned model that utilizes one or more COD-snapshot transfer functions that correlate the one or more synthetic snapshots with historical snapshot data associated with the asset. For instance, as shown in FIG. 8, the synthetic snapshot data including the generated synthetic snapshots can be fed or input into a machine-learned model that utilizes one or more COD-snapshot transfer functions that correlate the one or more synthetic snapshots with historical snapshot data associated with the asset. Particularly, the COD-snapshot transfer functions can utilize the values for the parameters of the synthetic snapshots and create new snapshots of data. The machine-learned model can be trained based at least in part on the historical snapshot data associated with the asset and fleet historical snapshot data associated with other assets that are a same model as the asset. Further, the method (400) can include adding, by the one or more processors, the one or more new snapshots to the snapshot data, wherein the one or more new snapshots are added to the snapshot data prior to the output indicating the health status of the asset or the one or more components thereof is generated.

At (408), the method (400) includes generating, by the one or more processors, an output indicating a health status of the asset or one or more components thereof based at least in part on the snapshot data and the synthetic snapshot data. Accordingly, the health status of the engine is generated using a snapshot-COD based approach. That is, the output indicating the health status is generated based on snapshot data and synthetic snapshot data, which is generated based on COD. Further, in implementations in which new snapshots are created based at least in part on the generated synthetic snapshot data, the output indicating the health status of the aviation gas turbine engine or one or more components thereof based at least in part on the one or more snapshots, new snapshots, and synthetic snapshots.

In some implementations, to ultimately generate the output, the method (400) includes applying, by the one or more processors, one or more time-series pattern recognition techniques to the snapshot data to determine at least one alert score associated with the snapshot data, the at least one alert score associated with the snapshot data being determined based at least in part on one or more detected features associated with the parameter values for the one or more parameters of the snapshot data. Further, the method (400) includes applying, by the one or more processors, one or more time-series pattern recognition techniques to the synthetic snapshot data to determine at least one alert score associated with the synthetic snapshot data, the at least one alert score associated with the synthetic snapshot data being determined based at least in part on one or more detected features associated with the parameter values for the one or more parameters of the synthetic snapshot data. In such implementations, the output indicating the health status of the asset or the one or more components thereof is generated based at least in part on the at least one alert score associated with the snapshot data and the at least one alert score associated with the synthetic snapshot data.

Moreover, in some implementations, the method (400) includes aggregating, by the one or more processors, the at least one alert score associated with the snapshot data and the at least one alert score associated with the synthetic snapshot data via a probabilistic aggregation technique into an aggregated alert score. In such implementations, the output indicating the health status of the asset or the one or more components thereof is generated based at least in part on the aggregated alert score.

In some implementations, the system (e.g., the system 100 of FIG. 2) or a second system associated with the system can perform a control action based at least in part on the generated output indicating the health status of the asset or one or more components thereof. By way of example, an EEC of an engine can control the gas turbine engine based at least in part on the health status of the engine or a component of module thereof (e.g., a compressor). For instance, the EEC can control the gas turbine engine to operate more or less aggressively based on the health status. As another example, a maintenance system can receive the health status and automatically schedule a service visit based at least in part on the outputted health status associated with the asset.

The system and method disclosed herein provide a number of technical and commercial advantages and benefits. For instance, system and method disclosed herein can provide automated health assessments of an asset or one or more components of an asset, such as a compressor. Such automated assessments can be provided in or near real-time. Further, by using COD in conjunction with snapshot data, the health state of an asset or one or more components thereof can be improved compared to traditional methods and systems. Further, the output indicative of the health state can provide a basis for optimal asset utilization and planning engine removal/maintenance activities. Furthermore, the system and method disclosed herein provide a non-intrusive technique for determining a health state. Moreover, the system and method disclosed herein provide opportunity to identify asset specific maintenance needs in service and reduces UER and significant failure events while achieving asset mission and maximizing TOW. In addition, the system and method disclosed herein provide opportunity to modify asset usage to maximize asset in service value.

Figure 12:
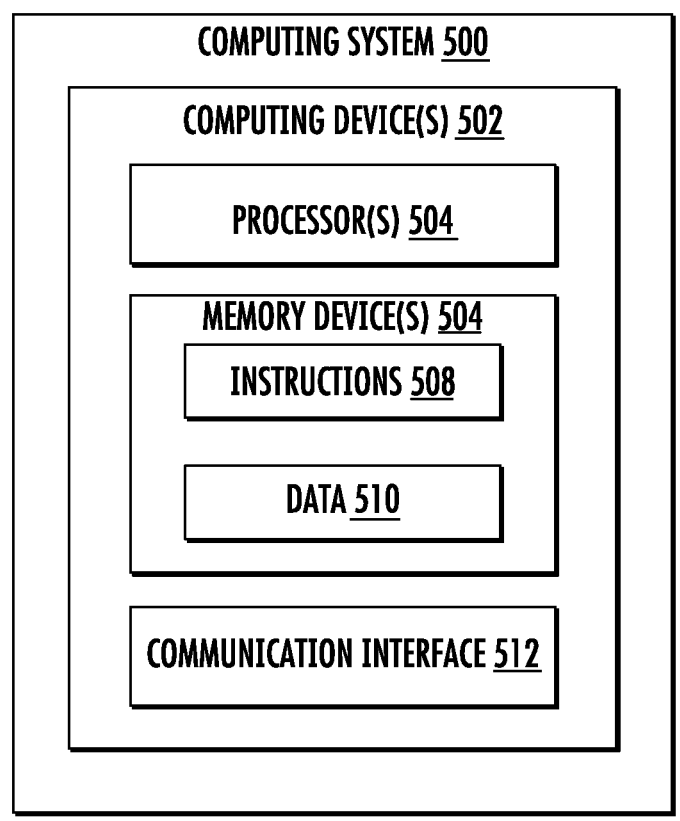
FIG. 12 provides a schematic view of an example computing system for implementing one or more aspects of the present subject matter.

FIG. 12 provides a block diagram of an example computing system 500 that can be used to implement methods and systems described herein according to example embodiments of the present subject. The computing system 500 is one example of a suitable computing system for implementing the computing elements of the system 100 described herein.

As shown in FIG. 12, the computing system 500 includes one more computing device(s) 502. The one or more computing device(s) 502 can include one or more processor(s) 504 and one or more memory device(s) 506. The one or more processor(s) 504 can include any suitable processing device, such as a microprocessor, microcontroller, integrated circuit, logic device, or other suitable processing device. The one or more memory device(s) 506 can include one or more computer-readable medium, including, but not limited to, non-transitory computer-readable medium or media, RAM, ROM, hard drives, flash drives, and other memory devices, such as one or more buffer devices.

The one or more memory device(s) 506 can store information accessible by the one or more processor(s) 504, including computer-readable instructions 508 that can be executed by the one or more processor(s) 504. The instructions 508 can be any set of instructions that, when executed by the one or more processor(s) 504, cause the one or more processor(s) 504 to perform operations. The instructions 508 can be software written in any suitable programming language or can be implemented in hardware. The instructions 508 can be any of the computer-readable instructions noted herein. Each module noted herein can include associated computer-readable instructions.

The memory device(s) 506 can further store data 510 that can be accessed by the processor(s) 504. For example, the data 510 can include received data, such as COD and snapshot data. The data 510 can include one or more table(s), function(s), algorithm(s), model(s), equation(s), etc. according to example embodiments of the present subject matter.

The one or more computing device(s) 502 can also include a communication interface 512 used to communicate, for example, with other components or systems, such as maintenance systems, aircraft systems, etc. The communication interface 512 can include any suitable components for interfacing with one or more network(s), including for example, transmitters, receivers, ports, controllers, antennas, or other suitable components.

The technology discussed herein makes reference to computer-based systems and actions taken by and information sent to and from computer-based systems. It will be appreciated that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

Further aspects of the invention are provided by the subject matter of the following clauses:

1. A system, comprising: one or more memory devices; and one or more processors, the one or more processors configured to: receive continuous operating data associated with an asset, the continuous operating data including parameter values for one or more parameters over a collection time period; generate synthetic snapshot data based at least in part on the continuous operating data, the synthetic snapshot data including one or more synthetic snapshots each containing the parameter values for the one or more parameters for a given timepoint within the collection time period; receive snapshot data associated with the asset, the snapshot data including one or more snapshots each containing parameter values for the one or more parameters for a given timepoint during operation of the asset; and generate an output indicating a health status of the asset or one or more components thereof based at least in part on the snapshot data and the synthetic snapshot data.

2. The system of any preceding clause, wherein the one or more processors are further configured to: create one or more new snapshots by applying a machine-learned model that utilizes one or more COD-snapshot transfer functions that correlate the one or more synthetic snapshots with historical snapshot data associated with the asset.

3. The system of any preceding clause, wherein the one or more processors are further configured to: add the one or more new snapshots to the snapshot data, wherein the one or more new snapshots are added to the snapshot data prior to the output indicating the health status of the asset or the one or more components thereof is generated.

4. The system of any preceding clause, wherein the machine-learned model is trained based at least in part on the historical snapshot data associated with the asset and fleet historical snapshot data associated with other assets that are a same model as the asset.

5. The system of any preceding clause, wherein the one or more processors are further configured to: apply one or more time-series pattern recognition techniques to the snapshot data to determine at least one alert score associated with the snapshot data, the at least one alert score associated with the snapshot data being determined based at least in part on one or more detected features associated with the parameter values for the one or more parameters of the snapshot data; and apply one or more time-series pattern recognition techniques to the synthetic snapshot data to determine at least one alert score associated with the synthetic snapshot data, the at least one alert score associated with the synthetic snapshot data being determined based at least in part on one or more detected features associated with the parameter values for the one or more parameters of the synthetic snapshot data, and wherein the output indicating the health status of the asset or the one or more components thereof is generated based at least in part on the at least one alert score associated with the snapshot data and the at least one alert score associated with the synthetic snapshot data.

6. The system of any preceding clause, wherein the one or more processors are further configured to: aggregate the at least one alert score associated with the snapshot data and the at least one alert score associated with the synthetic snapshot data via a probabilistic aggregation technique into an aggregated alert score, and wherein the output indicating the health status of the asset or the one or more components thereof is generated based at least in part on the aggregated alert score.

7. The system of any preceding clause, wherein at least one of the one or more synthetic snapshots is created at a timepoint within a defined operation phase of the collection time period that corresponds with a maximum or minimum value for a given parameter of the one or more parameters.

8. The system of any preceding clause, wherein the system or a second system associated with the system performs a control action based at least in part on the generated output indicating the health status of the asset or one or more components thereof.

9. The system of any preceding clause, wherein the asset is an aviation gas turbine engine.

10. A method, comprising: receiving, by one or more processors of a system, continuous operating data associated with an asset, the continuous operating data including parameter values for one or more parameters over a collection time period; generating, by the one or more processors, synthetic snapshot data based at least in part on the continuous operating data, the synthetic snapshot data including one or more synthetic snapshots each containing the parameter values for the one or more parameters for a given timepoint within the collection time period; receiving, by the one or more processors, snapshot data associated with the asset, the snapshot data including one or more snapshots each containing parameter values for the one or more parameters for a given timepoint during operation of the asset; and generating, by the one or more processors, an output indicating a health status of the asset or one or more components thereof based at least in part on the snapshot data and the synthetic snapshot data.

11. The method of any preceding clause, further comprising: creating, by the one or more processors, one or more new snapshots by applying a machine-learned model that utilizes one or more COD-snapshot transfer functions that correlate the one or more synthetic snapshots with historical snapshot data associated with the asset.

12. The method of any preceding clause, further comprising: adding, by the one or more processors, the one or more new snapshots to the snapshot data, wherein the one or more new snapshots are added to the snapshot data prior to the output indicating the health status of the asset or the one or more components thereof is generated.

13. The method of any preceding clause, wherein the machine-learned model is trained based at least in part on the historical snapshot data associated with the asset and fleet historical snapshot data associated with other assets that are a same model as the asset.

14. The method of any preceding clause, further comprising: applying, by the one or more processors, one or more time-series pattern recognition techniques to the snapshot data to determine at least one alert score associated with the snapshot data, the at least one alert score associated with the snapshot data being determined based at least in part on one or more detected features associated with the parameter values for the one or more parameters of the snapshot data; applying, by the one or more processors, one or more time-series pattern recognition techniques to the synthetic snapshot data to determine at least one alert score associated with the synthetic snapshot data, the at least one alert score associated with the synthetic snapshot data being determined based at least in part on one or more detected features associated with the parameter values for the one or more parameters of the synthetic snapshot data, and wherein the output indicating the health status of the asset or the one or more components thereof is generated based at least in part on the at least one alert score associated with the snapshot data and the at least one alert score associated with the synthetic snapshot data.

15. The method of any preceding clause, further comprising: aggregating, by the one or more processors, the at least one alert score associated with the snapshot data and the at least one alert score associated with the synthetic snapshot data via a probabilistic aggregation technique into an aggregated alert score, and wherein the output indicating the health status of the asset or the one or more components thereof is generated based at least in part on the aggregated alert score.

16. The method of any preceding clause, wherein at least one of the one or more synthetic snapshots is created at a timepoint within a defined operation phase of the collection time period that corresponds with a maximum or minimum value for a given parameter of the one or more parameters.

17. The method of any preceding clause, wherein the system or a second system associated with the system performs a control action based at least in part on the generated output indicating the health status of the asset or one or more components thereof.

18. The method of any preceding clause, wherein the asset is an aviation gas turbine engine.

19. The method of any preceding clause, further comprising: determining, by the one or more processors, one or more values for additional parameters associated with the asset, the one or more values for the additional parameters being determined using the continuous operating data, and wherein the continuous operating data used to generate the synthetic snapshot data contains the one or more values for the additional parameters associated with the asset.

20. A method, comprising: receiving, by one or more processors of a system, continuous engine operating data associated with an aviation gas turbine engine, the continuous engine operating data including parameter values for one or more parameters over a collection time period; generating, by the one or more processors, synthetic snapshot data based at least in part on the continuous engine operating data, the synthetic snapshot data including one or more synthetic snapshots each containing the parameter values for the one or more parameters for a given timepoint within the collection time period; creating, by the one or more processors, one or more new snapshots by applying a machine-learned model that utilizes one or more COD-snapshot transfer functions that correlate the one or more synthetic snapshots with historical snapshot data associated with the aviation gas turbine engine; receiving, by the one or more processors, snapshot data associated with the gas turbine engine, the snapshot data including one or more snapshots each containing parameter values for the one or more parameters for a given timepoint within the collection time period; adding, by the one or more processors, the one or more new snapshots to the snapshot data; and generating, by the one or more processors, an output indicating a health status of the aviation gas turbine engine or one or more components thereof based at least in part on the one or more snapshots, new snapshots, and synthetic snapshots.

What is claimed is:

1. A method, comprising:
   collecting, with one or more sensors of a system, continuous operating data associated with a gas turbine engine that is operating and snapshot data associated with the gas turbine engine;
   receiving, by one or more processors of the system, the continuous operating data associated with the gas turbine engine collected by the one or more sensors over a collection time period, the continuous operating data including parameter values for one or more parameters over the collection time period;
   generating, by the one or more processors, synthetic snapshot data based at least in part on sensed parameter values for the one or more parameters from the continuous operating data collected by the one or more sensors, the synthetic snapshot data including one or more synthetic snapshots each containing calculated parameter values for the one or more parameters for a given timepoint within the collection time period;
   receiving, by the one or more processors, the collected snapshot data associated with the gas turbine engine collected by the one or more sensors, the collected snapshot data including one or more snapshots each containing sensed parameter values for the one or more parameters for a given timepoint during operation of the gas turbine engine;
   creating, by the one or more processors, one or more new snapshots to form new snapshot data by applying a machine-learned model that utilizes one or more COD-snapshot transfer functions that correlate the one or more synthetic snapshots with historical snapshot data associated with the gas turbine engine;

adding the new snapshot data to the collected snapshot data associated with the gas turbine engine to form snapshot data;
generating, by the one or more processors, an output indicating a health status of the gas turbine engine or one or more components thereof based at least in part on the snapshot data and the synthetic snapshot data; and
performing a control action including scheduling, with a maintenance system, a service visit for the gas turbine engine based on the generated output indicating the health status of the gas turbine engine or the one or more components thereof.

2. The method of claim 1, further comprising:
wherein the one or more new snapshots are added to the snapshot data prior to the output indicating the health status of the gas turbine engine or the one or more components thereof is generated.

3. The method of claim 1, wherein the machine-learned model is trained based at least in part on the historical snapshot data associated with the gas turbine engine and fleet historical snapshot data associated with other gas turbine engines that are a same model as the gas turbine engine.

4. The method of claim 1, further comprising:
applying, by the one or more processors, one or more time-series pattern recognition techniques to the snapshot data to determine at least one alert score associated with the snapshot data, the at least one alert score associated with the snapshot data being determined based at least in part on one or more detected features associated with the parameter values for the one or more parameters of the snapshot data;
applying, by the one or more processors, one or more time-series pattern recognition techniques to the synthetic snapshot data to determine at least one alert score associated with the synthetic snapshot data, the at least one alert score associated with the synthetic snapshot data being determined based at least in part on one or more detected features associated with the parameter values for the one or more parameters of the synthetic snapshot data, and
wherein the output indicating the health status of the gas turbine engine or the one or more components thereof is generated based at least in part on the at least one alert score associated with the snapshot data and the at least one alert score associated with the synthetic snapshot data.

5. The method of claim 1, wherein at least one of the one or more synthetic snapshots is created at a timepoint within a defined operation phase of the collection time period that corresponds with a maximum or minimum value for a given parameter of the one or more parameters.

6. The method of claim 1, further comprising:
determining, by the one or more processors, one or more values for additional parameters associated with the gas turbine engine, the one or more values for the additional parameters being determined using the continuous operating data, and
wherein the continuous operating data used to generate the synthetic snapshot data contains the one or more values for the additional parameters associated with the gas turbine engine.

7. The system of claim 1, wherein performing the control action further comprises identifying gas turbine specific maintenance needs that reduce unscheduled engine removals (UER) and maximize Time-On-Wing (TOW).

8. The system of claim 1, further comprising adjusting an operation of a component of the gas turbine engine based at least in part on the generated output indicating the health status of the gas turbine engine or the one or more components thereof.

9. The method of claim 4, further comprising:
aggregating, by the one or more processors, the at least one alert score associated with the snapshot data and the at least one alert score associated with the synthetic snapshot data via a probabilistic aggregation technique into an aggregated alert score, and
wherein the output indicating the health status of the gas turbine engine or the one or more components thereof is generated based at least in part on the aggregated alert score.

10. A system comprising, comprising:
a gas turbine engine having one or more sensors; and
a computing system having one or more memory devices and one or more processors, the one or more processors configured to:
collect continuous operating data associated with the gas turbine engine and snapshot data associated with the gas turbine engine with the one or more sensors;
receive the continuous operating data associated with the gas turbine engine collected by the one or more sensors over a collection time period, the continuous operating data including sensed parameter values for one or more parameters over the collection time period;
generate synthetic snapshot data based at least in part on the sensed parameter values for the one or more parameters from the continuous operating data collected by the one or more sensors, the synthetic snapshot data including one or more synthetic snapshots each containing calculated parameter values for the one or more parameters for a given timepoint within the collection time period;
receive the collected snapshot data associated with the gas turbine engine collected by the one or more sensors, the collected snapshot data including one or more snapshots each containing sensed parameter values for the one or more parameters for a given timepoint during operation of the gas turbine engine;
create one or more new snapshots to form new snapshot data by applying a machine-learned model that utilizes one or more COD-snapshot transfer functions that correlate the one or more synthetic snapshots with historical snapshot data associated with the gas turbine engine;
add the new snapshot data to the collected snapshot data associated with the gas turbine engine to form snapshot data; and
generate an output indicating a health status of the gas turbine engine or one or more components thereof based at least in part on the snapshot data and the synthetic snapshot data.

11. The system of claim 10, wherein the one or more processors are further configured to:
wherein the one or more new snapshots are added to the snapshot data prior to the output indicating the health status of the gas turbine engine or the one or more components thereof is generated.

12. The system of claim 10, wherein the machine-learned model is trained based at least in part on the historical snapshot data associated with the gas turbine engine and fleet historical snapshot data associated with other gas turbine engines that are a same model as the gas turbine engine.

13. The system of claim 10, wherein the one or more processors are further configured to:
    apply one or more time-series pattern recognition techniques to the snapshot data to determine at least one alert score associated with the snapshot data, the at least one alert score associated with the snapshot data being determined based at least in part on one or more detected features associated with the parameter values for the one or more parameters of the snapshot data; and
    apply one or more time-series pattern recognition techniques to the synthetic snapshot data to determine at least one alert score associated with the synthetic snapshot data, the at least one alert score associated with the synthetic snapshot data being determined based at least in part on one or more detected features associated with the parameter values for the one or more parameters of the synthetic snapshot data,
    wherein the output indicating the health status of the gas turbine engine or the one or more components thereof is generated based at least in part on the at least one alert score associated with the snapshot data and the at least one alert score associated with the synthetic snapshot data.

14. The system of claim 10, wherein at least one of the one or more synthetic snapshots is created at a timepoint within a defined operation phase of the collection time period that corresponds with a maximum or minimum value for a given parameter of the one or more parameters.

15. The system of claim 10, wherein the system or a second system associated with the system performs a control action including adjusting an operation of a component of the gas turbine engine based at least in part on the generated output indicating the health status of the gas turbine engine or the one or more components thereof.

16. The system of claim 13, wherein the one or more processors are further configured to:
    aggregate the at least one alert score associated with the snapshot data and the at least one alert score associated with the synthetic snapshot data via a probabilistic aggregation technique into an aggregated alert score, and
    wherein the output indicating the health status of the gas turbine engine or the one or more components thereof is generated based at least in part on the aggregated alert score.

* * * * *